United States Patent [19]

Ma et al.

[11] Patent Number: 5,770,480
[45] Date of Patent: Jun. 23, 1998

[54] METHOD OF LEADS BETWEEN CHIPS ASSEMBLY

[75] Inventors: Manny Kin F. Ma; Jeffrey D. Bruce; Daryl L. Habersetzer, all of Boise; Gordon D. Roberts, Meridian; James E. Miller, Boise, all of Id.

[73] Assignee: Micron Technology, Inc., Boise, Id.

[21] Appl. No.: 833,863

[22] Filed: Apr. 10, 1997

Related U.S. Application Data

[62] Division of Ser. No. 664,409, Jun. 17, 1996, Pat. No. 5,677,567.

[51] Int. Cl.[6] .......................... H01L 21/44; H01L 21/48; H01L 21/50
[52] U.S. Cl. ...................... 438/123; 438/107; 438/108; 438/109
[58] Field of Search ................................. 438/107, 108, 438/109, 123, 366, 368

[56] References Cited

U.S. PATENT DOCUMENTS

| | | |
|---|---|---|
| 3,839,782 | 10/1974 | Lincoln . |
| 3,893,158 | 7/1975 | Lincoln . |
| 4,701,999 | 10/1987 | Palmer . |
| 4,862,245 | 8/1989 | Pashby et al. . |
| 4,862,322 | 8/1989 | Bickford et al. . |
| 5,012,323 | 4/1991 | Farnworth . |
| 5,147,815 | 9/1992 | Casto . |
| 5,252,857 | 10/1993 | Kane et al. . |
| 5,291,061 | 3/1994 | Ball . |
| 5,323,060 | 6/1994 | Fogal et al. . |
| 5,331,235 | 7/1994 | Chun . |
| 5,399,898 | 3/1995 | Rostoker . |
| 5,434,745 | 7/1995 | Shokrgozar et al. . |
| 5,438,224 | 8/1995 | Papageorge et al. . |
| 5,455,445 | 10/1995 | Kurtz et al. . |
| 5,468,681 | 11/1995 | Pasch . |
| 5,471,369 | 11/1995 | Honda et al. . |
| 5,477,086 | 12/1995 | Rostoker et al. . |

FOREIGN PATENT DOCUMENTS

| | | |
|---|---|---|
| 474-224-A | 3/1992 | European Pat. Off. . |
| 62-90958 | 4/1987 | Japan . |

*Primary Examiner*—John Niebling
*Assistant Examiner*—David A. Zarneke
*Attorney, Agent, or Firm*—Trask Britt & Rossa

[57] ABSTRACT

A device and method for increasing integrated circuit density comprising at least a pair of superimposed dice, wherein a least one of the superimposed dice has at least one bond pad variably positioned on an active surface of the die. A plurality of lead fingers from a leadframe extend between the dice. The leadframe comprises at least one lead with leads of non-uniform length and configuration to attach to the differently positioned bond pads of the multiple die. An advantage of the present invention is that it allows dice with differing bond pad arrangements to be used in a superimposed configuration to increase circuit density, while eliminating the use of bond wires in such a configuration.

15 Claims, 6 Drawing Sheets

METHOD OF LEADS BETWEEN CHIPS ASSEMBLY

BACKGROUND OF THE INVENTION

Prior Application

This is a divisional of application Ser. No. 08/664,409, filed Jun. 17, 1996 now U.S. Pat. No. 5,677,567.

Field of the Invention

The present invention relates to an improved semiconductor device and method for increasing semiconductor device density. In particular, the present invention relates to a device and method utilizing a leads-between-chip leadframe.

State of the Art

High performance, low cost, increased miniaturization of components, and greater packaging density of integrated circuits have long been goals of the computer industry. As a general matter, semiconductor substrate assemblies, such as motherboards or function cards to be placed in a motherboard expansion bus slot, comprise a multitude of integrated circuit chips which are coupled to each other in order to make the assembly functional. For example, a central processing unit ("CPU") or microprocessor and a plurality of memory devices or chips may be electrically coupled to each other in order to provide operational control for the semiconductor substrate assembly. Ordinarily, the CPU and the memory devices are proximate to each other on one surface or on opposing surfaces of the motherboard or function card. The terminals of the integrated circuit chips (CPU and memory chips) are coupled to each other by means of circuit traces disposed on or in the motherboard or function card and extending from one individual chip (bare or packaged) to another. However, this standard chip arrangement requires substantial surface area or "real estate" for positioning each integrated circuit chip on the circuit board. Thus, integrated circuit density on a circuit board or other carrier, for any given level of component and internal conductor density, is substantially limited by the space available for die mounting.

In order to maximize real estate utilization, vertical stacking or superimposition of integrated circuit chips or dice has become common practice. U.S. Pat. No. 5,012,323 issued Apr. 30, 1991 to Farnworth ("Farnworth") teaches combining a pair of dice mounted on opposing sides of a leadframe. An upper die is back-bonded to the upper surface of the leads of the leadframe via a first adhesively coated, insulative layer. The lower die is face-bonded to the lower leadframe die-bonding region via a second, adhesively coated, insulative, film layer. The wirebonding pads on both upper and lower dice are interconnected with the ends of their associated lead extensions with gold or aluminum wires. The lower die needs to be slightly larger than the upper die in order that the lower die bonding pads are accessible from above through an aperture in the leadframe, such that gold wire connections can be made to the lead extensions. However, this arrangement has a major disadvantage from a production standpoint, since the different size dice require that different equipment produce the different dice and assemble some with the lead frame or that the same equipment be switched over in different production runs to produce and assemble the different dice and leadframe. Moreover, the leadframe design employed by Farnworth employs long conductor runs between the die and the exterior of the package, and the leadframe configuration is specialized and rather complex.

U.S. Pat. No. 5,291,061 issued Mar. 1, 1994 to Ball ("Ball") teaches a multiple stacked die device that contains up to four dice, which device does not exceed the height of then current single die packages. The low profile of the device is achieved by close-tolerance stacking which is made possible by a low-loop-profile wirebonding operation and thin-adhesive layers between the stack dice. However, Ball secures all of the dice to the same (upper) side of the leadframe, necessarily increasing bond wire length, even if some of the leads are bent upwardly, as disclosed. Moreover, Ball employs a die paddle to support the die stack, a technique which may require an extra die-attach step, and which increases the distance between the inner lead ends and even the lowermost die in the stack, resulting in longer bond wires.

U.S. Pat. No. 5,323,060 issued Jun. 21, 1994 to Fogal et al. ("Fogal") teaches a multichip module that contains stacked die devices, the terminals or bond pads of which are wirebonded to a substrate or to adjacent die devices. However, the stacked configuration of Fogal results in relatively long bond wires and requires a supporting substrate carrying conductor traces.

Each of the stacked die configurations disclosed in the above references uses bond wires which give rise to a common problem of bond wire sweep. When encapsulating a bare die assembly, the die assembly is generally placed in a mold wherein a molten filled-polymer encapsulate material is injected into the mold to surround the die assembly as it conforms to the mold. However, the encapsulant flow front attendant to this process causes stresses on the bond wires. Since the molten capsulating material is viscous, it tends to place forces transverse to at least some of the bond wires as the encasing material is injected into the mold. These directional forces cause the bond wires to flex which can, in turn, cause the bond wires to short with adjacent bond wires or bond pads.

An alternate method for lead attachment in a stacked die arrangement is the "leads over chip" ("LOC") configuration. U.S. Pat. No. 4,862,245 issued Aug. 29, 1989 to Pashby discloses an LOC configuration, wherein the inner lead ends of a standard dual in-line package ("DIP") leadframe configuration extend over and are secured to an upper or active surface of the die through a dielectric layer. The bond wire length is thus shortened by placing the inner lead ends in close proximity to a central row of die bond pads, and the lead extensions purportedly enhance heat transfer from the die. However, the Pashby LOC configuration as disclosed relates to mounting and bonding only a single die.

U.S. Pat. No. 5,438,224 issued Aug. 1, 1995 to Papageorge et al. ("Papageorge") discloses an integrated circuit package with a stacked integrated circuit chip arrangement placed on a circuit substrate. The stacked arrangement comprises a first flip chip and a second flip chip positioned face to face with a substrate interposed between the chips to provide electrical connection among the terminals of the flip chips and external circuitry. However, the Papageorge stacked arrangement uses a TAB or flex circuit substrate between the facing flip chips, and thus requires a separate mechanical support, such as a printed circuit board for the assembly. The design also renders fabrication more difficult due to the lack of rigid support for the chips.

FIG. 1 of the drawings schematically illustrates a typical prior art leadframe 100. The leadframe 100 comprises a plurality of lead fingers 102 and a die-attach paddle 104. The shaded areas 106 are removed in the post-encapsulation trim and form process. FIG. 2 illustrates the leadframe 100 utilized in a wire-bonded bare die assembly 200. Components common to both FIGS. 1 and 2 retain the same numeric designation. The assembly 200 comprises a semiconductor die 202 having a plurality of bond pads 204 on an upper surface 206 of the semiconductor die 202. The semiconductor die 202 is adhered by its back side (not shown) to the leadframe paddle 104 with an appropriate adhesive, such as a solder or an epoxy as known in the art. The semiconductor die 202 achieves an electrical connection with the leadframe 100 with a plurality of bond wires 208 connected between each bond pad 204 and its respective lead finger 102. In wirebonding, a plurality of bond wires are attached, one at a time, to each bond pad on the semiconductor die and extend to a corresponding lead or trace end on the printed circuit board. The bond wires are generally attached through one of three industry-standard wirebonding techniques: ultrasonic bonding—using a combination of pressure and ultrasonic vibration bursts to form a metallurgical cold weld; thermocompression bonding—using a combination of pressure and elevated temperature to form a weld; and thermosonic bonding—using a combination of pressure, elevated temperature, and ultrasonic vibration bursts.

With the wirebonding process, it is possible to attach the lead fingers of a leadframe to bond pads in a variety of locations on a semiconductor die. However, effective bond wire lengths are limited, and wires cannot cross or lie in too-close proximity without shorting. Further, the use of bond wires has the disadvantage of bond sweep when encapsulating a bare die, as discussed above. The problem of bond sweep is exacerbated with longer bond wires, and by bond wires which are too closely spaced. Finally, even automated wire bonding is a time-consuming process in relative terms.

FIG. 3 illustrates one type of prior art LOC-attached, bare die assembly 300. The assembly 300 comprises a semiconductor die 302 having a plurality of bond pads 304 (shown in shadow lines) on an upper surface 306 of a semiconductor die 302. The semiconductor die 302 is electrically connected to a leadframe 308 though a plurality of lead fingers 310 which extend over the die upper surface 306 to directly electrically contact and attach to their respective bond pads 304. TAB or flex circuit-type lead frames are commonly employed for such an assembly. The aforementioned wire-bonded LOC arrangement as illustrated in the Pashby patent is, however, a more common LOC structure.

Therefore, it would be advantageous to develop a technique and assembly for increasing integrated circuit density and eliminating bond sweep using non-customized die configurations in combination with commercially-available, widely-practiced die support structures and semiconductor device fabrication techniques.

SUMMARY OF THE INVENTION

The present invention relates to a device and method for increasing integrated circuit density. The device comprises a pair of superimposed dice with a plurality of leads disposed between the dice. The device is produced by providing a leadframe with variable or non-uniform length, orientation and configuration of lead fingers. The variable lead finger length and configuration leadframe is disposed between the pair of facing, superimposed dice in a variable-leads-between-chips arrangement ("VLBC"). In one preferred embodiment, the VLBC leadframe comprises a paddle and a plurality of lead fingers of a variety of lengths, orientations and configurations. The assembly of the present invention preferably comprises a pair of flip chips (dice) with a plurality of solder or other conductive bumps on an active surface of each flip chip, wherein the flip chips are attached on and in electrical communication with both sides of the VLBC leadframe. This assembly provides a very compact and efficient method of providing multiple dice in the same package using a single VLBC leadframe.

The upper die and the lower die each have a plurality of bond pads on a face side or active surface thereof. The die bond pads can be in any positions or locations across the respective active surfaces. The bond pad patterns of the upper die and the lower die need not match. One advantage of the present invention is that no on-die electrical traces are necessary to route signals to a specific external connection site, such as along an edge of a semiconductor die. Thus, in the present invention, no additional die real estate is taken up by traces routing the signals to specific external connection sites. Furthermore, the steps of designing customized trace routes or forming the routes on the dice are eliminated, thereby reducing the cost of producing the semiconductor die.

In the present invention, the VLBC leadframe achieves the routing of the integrated circuit input and output signals to an appropriate lead. This system is both flexible and cost effective, because the VLBC leadframe design may easily be computer generated. Thus, the VLBC leadframe lead fingers can be quickly rearranged and optimized for specific bond pad patterns using computer software. The customized VLBC leadframe can then be quickly produced by existing computerized leadframe fabrication equipment. Therefore, every change of the dice in the pair and/or every bond pad reconfiguration of one of the dice can be rapidly accommodated without requiring a die redesign to alter on-die traces.

In practice, a passivation layer is preferably disposed between the upper and lower dice and the lead fingers of the VLBC leadframe. The passivation layer is particularly important to prevent potential shorting between the lead fingers and the upper die and/or the lower die under flow front forces imposed upon the assembly during encapsulation, and when a filler material contained within the polymer-based encapsulating material used to encapsulate the assembly has the potential of conducting any significant electric charge or current, or penetrating the on-die passivation layers on the active surfaces of the die.

Furthermore, the paddle of the VLBC leadframe (which need not be configured in a traditional paddle shape) may also be utilized as a signal-bearing lead finger, a power source lead, a common ground, or the like by either or both the upper die and the lower die.

It is, of course, understood that the lead fingers or finger segments do not necessarily have to extend from the bare die package. A lead finger or segment may be designed exchange signal(s) internal to the assembly between the upper die and the lower die.

In a preferred embodiment of the present invention, the upper and lower dice are identical in function, such as a pair of facing 2 Meg VRAMs. Thus, the above discussed arrangement would achieve a 4 Meg VRAM, yielding more memory in a low-profile, small, relatively inexpensive package consuming minimal real estate on the carrier substrate. Alternately, 8 MEG memory may be achieved by using two face-to-face 4 MEG DRAMS while 32 MEG memory may be achieved by using two 16 MEG DRAMS. The present invention is also particularly useful with chips which are staged, such as the output from one microprocessor and cache to another microprocessor and cache, since the conductive paths between the cooperating dice can be considerably shortened.

Although the upper die and the lower die do not have to be identical in size or type, it is preferable that both the upper die and the lower die and other materials of the assembly have compatible coefficients of thermal expansion. Similar coefficients of thermal expansion minimize any stress on the assembly induced by the uneven thermal expansion and contraction of the components.

As noted above, the dice of an assembly can have differing bond pad arrangements. However, when a pair of dice share a single signal, power source or ground, the single lead finger conducting the single signal should, of course, be configured to contact the required bond pad locations on each of the upper dice and the lower dice.

The present invention also has an additional benefit of reducing trace inductance. As semiconductor assemblies become smaller, inductance effects become more significant because the conductive paths become more densely packed and, in stacked die configurations, longer as a result of increasing bond wires lengths from the leadframe or printed circuit board to the elevated dice of the stack. The present invention has the effect of reducing inductance by shortening conductive paths in general when doubling the number of dice in a single space (superimposing the dice), sharing signals on a common conductor where possible, and eliminating wirebonding. Inductance is also substantially reduced between dice where signals are shared internal to the assembly between bond pads on superimposed dice, since only a short lead finger segment is necessary to connect the bond pads of the superimposed dice. In contrast, with prior art single-die packaging, a signal travelled to a companion die through traces on a circuit board or other carrier supporting both dice adjacently.

It is, of course, understood that the present invention is not limited to only superimposing two dice or to only a single die pair in a semiconductor assembly. A multitude of various arrangements with a plurality of dice can be constructed utilizing the concept of the present invention.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings, in which:

DETAILED DESCRIPTION OF THE PREFERRED EMBODIMENTS

Figure 1:
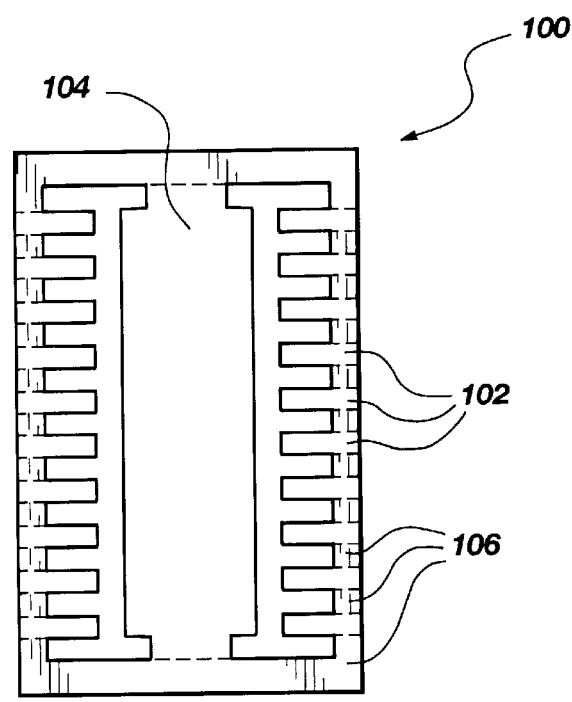
FIG. 1 is a top plan view of a prior art leadframe.
Figure 2:
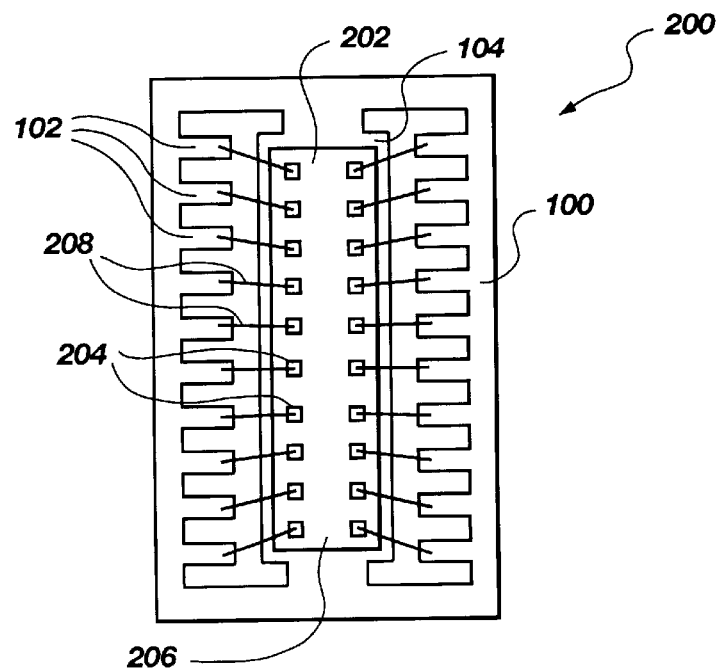
FIG. 2 is a top plan view of a prior art wirebonded leadframe semiconductor assembly.
Figure 3:
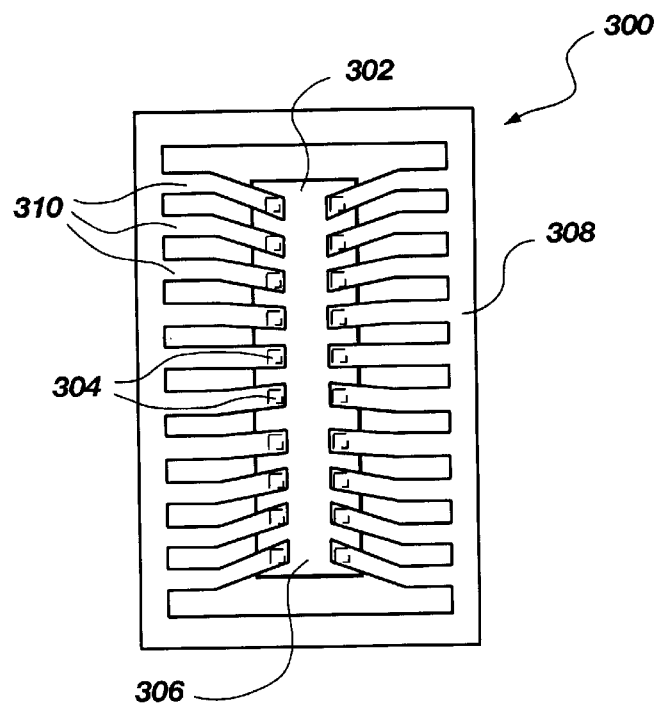
FIG. 3 is a top plan view of a prior art leads over chip semiconductor assembly.
Figure 4:
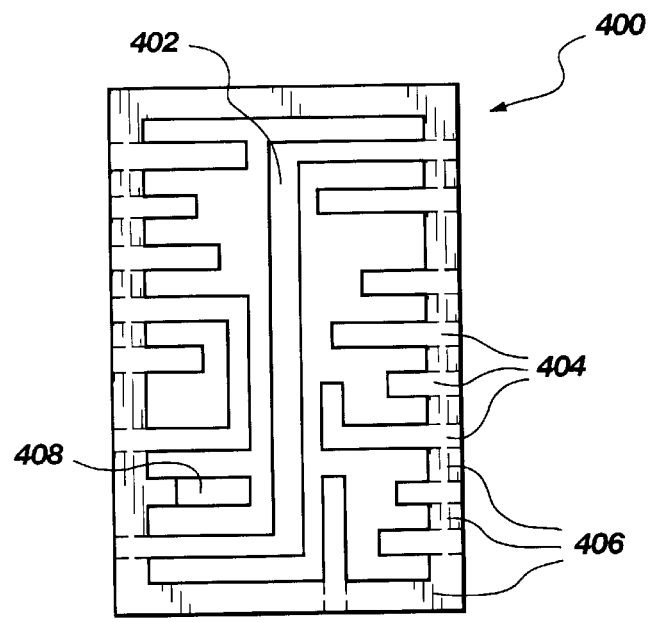
FIG. 4 is a top plan view of a leadframe of the present invention.

FIG. 4 schematically shows a variable-leads-between-chips ("VLBC") leadframe 400 of the present invention. The VLBC leadframe 400 comprises a "paddle" 402 and a plurality of lead fingers 404 of a variety of shapes and configurations. The shaded leadframe areas 406 are removed in the trim and form process. As noted previously, paddle 402, if employed, may assume a variety of non-traditional shapes, and even extend from one side of the leadframe to another via a zig-zag path as shown in FIG. 4, it being understood that the term "paddle" is one of convenience and does not conform to the requirements of a prior art die-attach paddle, since multiple leads extending within the "footprints" of the dice of the assembly provide the required physical support.

Figure 5:
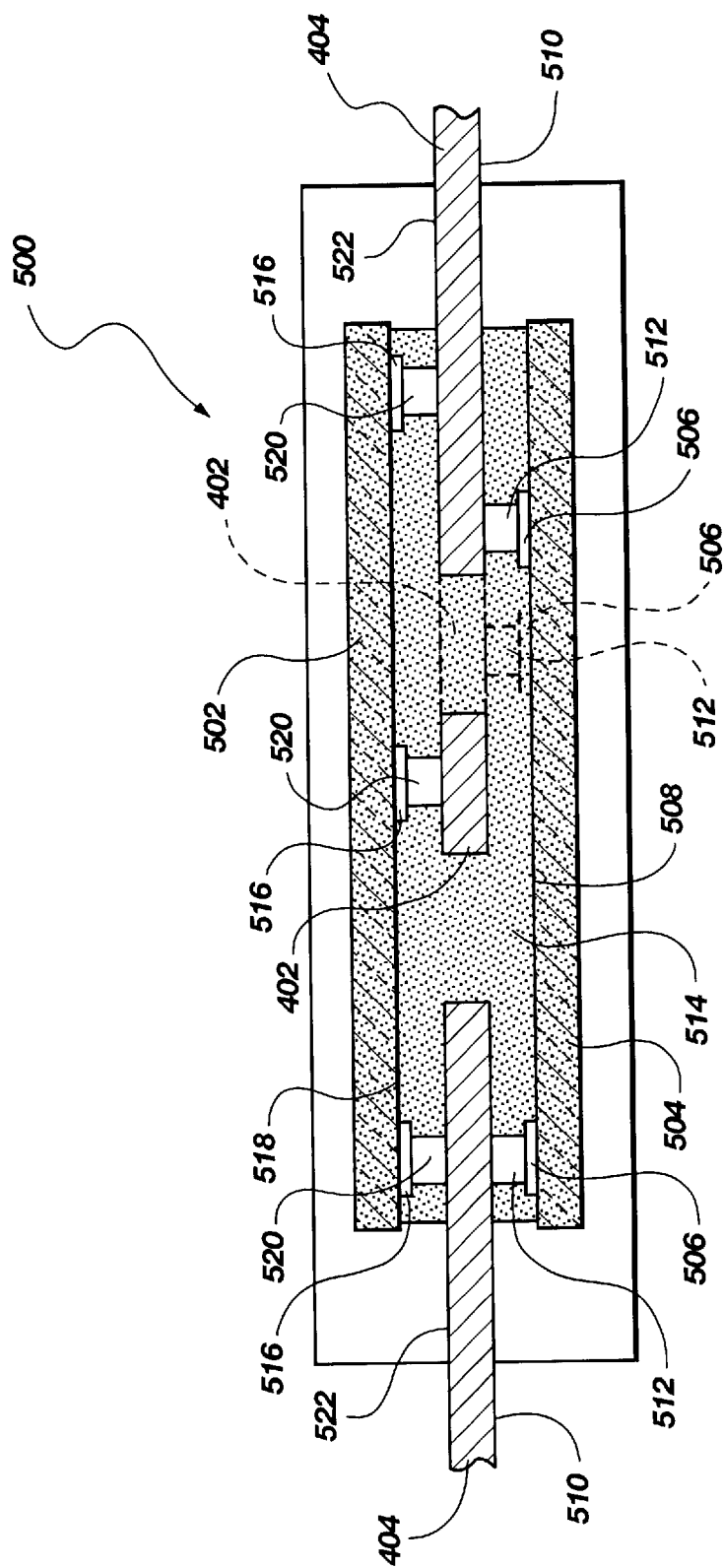
FIG. 5 is a side cross-sectional view of a chip assembly of the present invention.

FIG. 5 illustrates a cross sectional view of a die assembly 500 of the present invention. Components common to FIG. 4 and FIG. 5 retain the same numeric designation. The die assembly 500 comprises a pair of superimposed dice, an upper die 502 and a lower die 504, with the plurality of lead fingers 404 and the paddle 402 (as illustrated in FIG. 4) from a leadframe (remainder not shown) disposed between the upper die 502 and the lower die 504. The die assembly 500 is constructed by providing the lower die 504 which has a plurality of bond pads 506 on a face side or active surface 508 thereof. The plurality of lead fingers 404 from the remainder of leadframe (not shown) extends to their respective bond pads 506. The lower die bond pads 506 are attached to a lower surface 510 of the lead fingers 404 with solder bumps, conductive epoxy, a conductor-filled polymer, or other such conductive connective material elements 512, shown here for simplicity in pillar form. The lower die conductive connective material elements 512 can either be located initially (before attachment) on the bond pads 506 or the lead fingers 404. Physical attachment of the lower dice 504 to lead fingers 404 may be enhanced, as known in the art, by use of a screened-on adhesive or of a dielectric tape (such as polyimide) bearing adhesive on both sides. After the lower die 504 has been attached to the lead fingers 404 and paddle 402, a layer of passivation film 514 may be deposited over and between the lead fingers 404 and the lower die face side 508. Film 514 may comprise a polyimide, silicon dioxide, silicon nitride, Boron Phosphorous Silicon Glass (BPSG) or any of various photo-resists known in the art.

The upper die 502, which also carries a plurality of bond pads 516 on a face side or active surface 518, is also provided. The upper die bond pads 516 are attached to an upper surface 522 of the lead fingers 404 with solder bumps, conductive epoxy, conductor-filled polymer, or other such connective conductive material elements 520. The upper die connective conductive material 520 can also either be initially located on the bond pads 506 or the lead fingers 404. However, prior to the attachment of the upper die 502, the passivation film 514 is etched by any known industry technique to form vias (not shown) therein to expose selected areas of the upper surface 522 of the lead fingers 404 when the conductive material elements 520 are initially formed on bond pads 516 on the face side 518 of die 502, or etched to expose the upper die conductive connective material elements 520 when the conductive material elements 520 are initially formed on the lead fingers 404.

Rather than etching the passivation film 514, a selective deposition technique could be employed, such as a silk screen, over the upper surface 522 of the lead fingers 404 when applying the passivation film 514. A photoresist might also be employed, either positive or negative, followed by masking, exposure and development. It is also understood that the upper die 502 and the lower die 504 could be first attached to the lead fingers 404, then the passivation material 514 could be injected between the upper die 502 and the lower die 504, or the assembly dip-coated prior to encapsulation.

Additionally, the paddle 402 may also be utilized as a signal-bearing lead finger, a common power source lead, common ground, or the like by either or both the upper die 502 and the lower die 504. FIG. 5 shows electrical connection of the paddle 402 to a centrally-located upper die bond pad 516 with an upper die conductive connective material element 520. A similar, offset connection might be made to a bond pad 506 of lower die 504 as shown in broken lines so that, for example, both dice might share a common power input through "paddle" 402. Paddle 402 may also extend to the exterior of leadframe 400 at only one location instead of multiple locations as illustrated.

Once the upper die 502 and lower die 504 are adhered to the lead fingers 404, an encapsulant 524 is used to envelope the assembly, usually by transfer-molding techniques as well known in the art.

Figure 6:
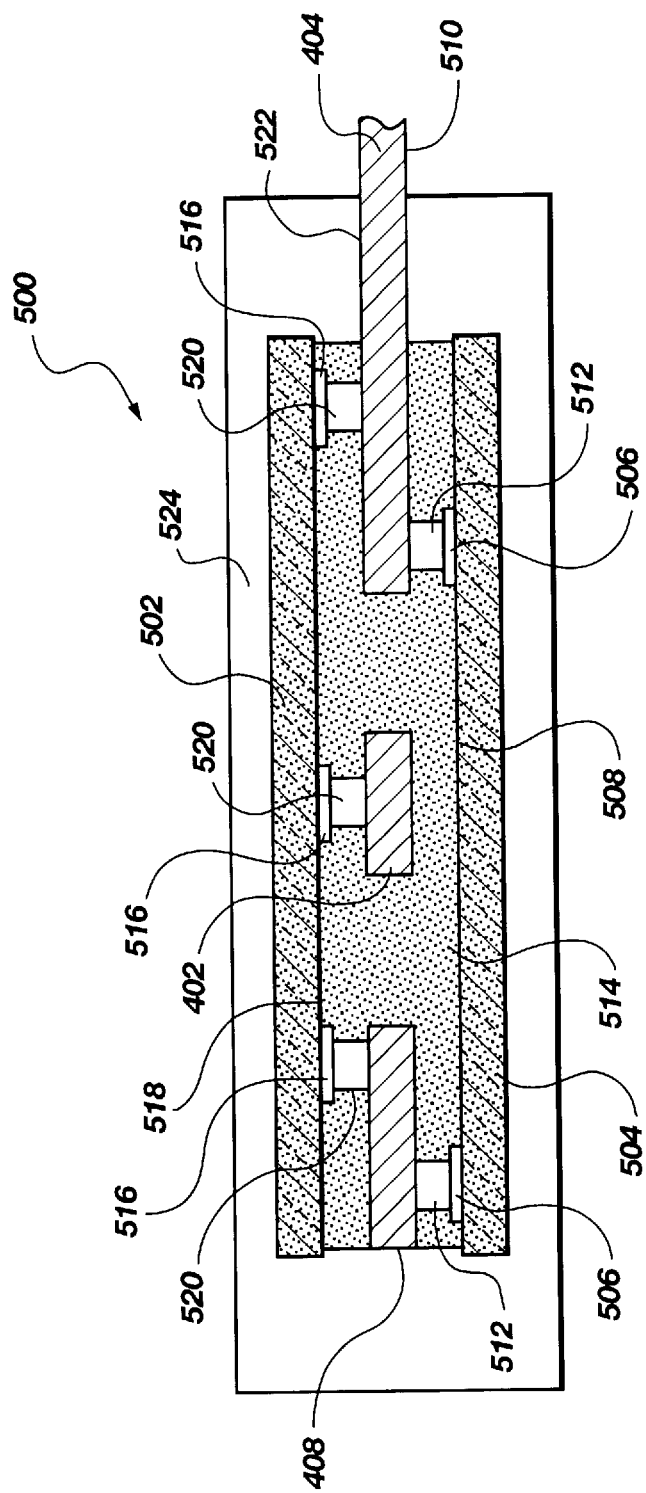
FIG. 6 is a side cross-sectional view of a chip assembly of the present invention illustrating a between chip lead finger.

All of the lead fingers 404 do not necessarily have to extend out of the bare die package. FIGS. 4 and 6 show a lead finger segment 408 which serves only to exchange signal(s) between the upper die 502 and the lower die 504, rather than electrically communicating circuitry external to the assembly. Components common to the FIGS. 4, 5 and 6 retain the same numeric designation. FIG. 6 shows the lead finger segment 408 connected between the upper die bond pad 516 and the lower die bond pad 506 by upper die conductive connective material element 520 and lower die conductive connective material element 512. The lead finger segment 408 is preferably detached near the edge of the bare die assembly in the trim and form process after dice 502 and 504 are assembled to leadframe 400.

Figure 7:
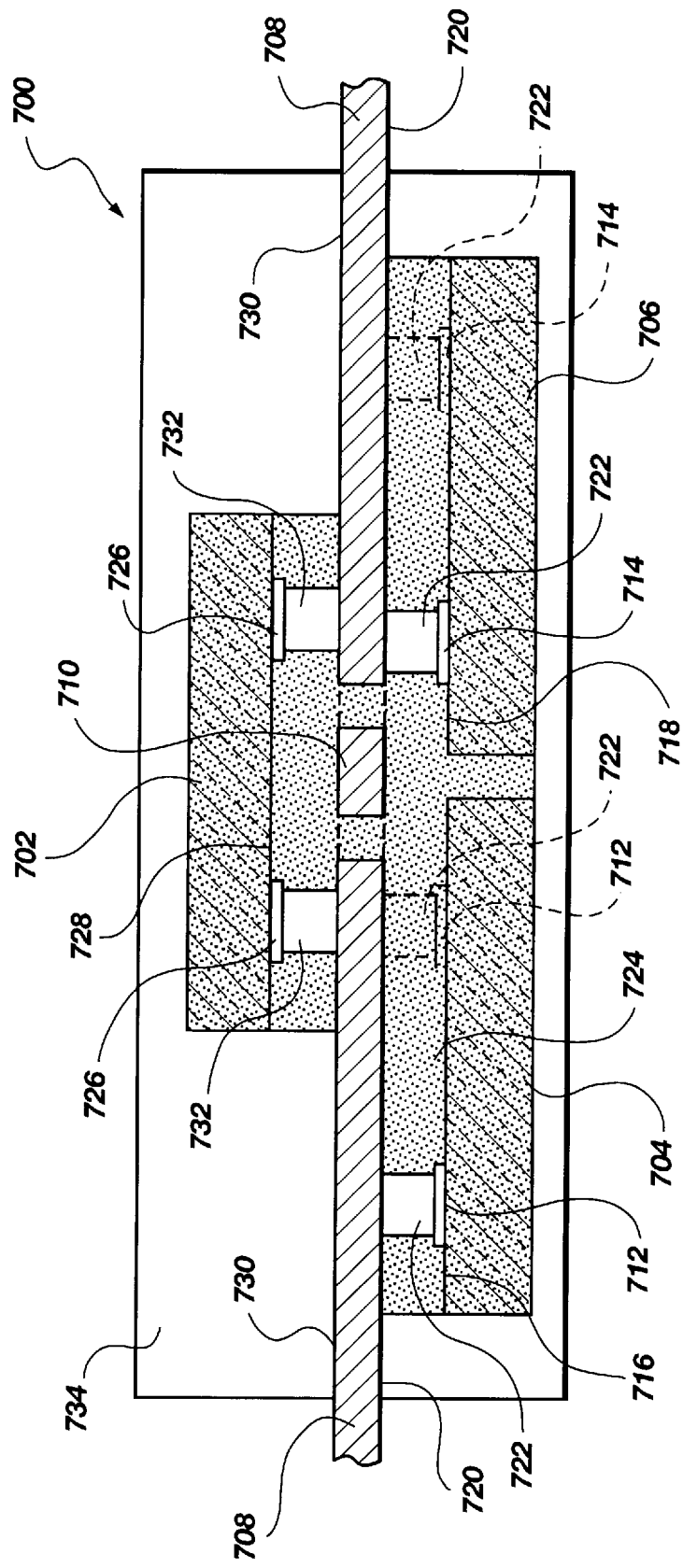
FIG. 7 is a side cross-sectional view of a multiple chip assembly of the present invention.

The concept of the present invention can also be utilized in a multiple chip assembly including more than two chips. FIG. 7 illustrates a cross-sectional view of a multiple die assembly 700 of the present invention. The multiple die assembly 700 comprises an upper die 702 partially superimposed over a first lower die 704 and a second lower die 706, with a plurality of lead fingers 708 and a paddle 710 from a leadframe (not shown), similar to the leadframe illustrated in FIG. 4, disposed between the upper die 702 and the first lower die 704 and the second die 706. The die assembly 700 is constructed by placing the first lower die 704 and the second lower die 706 face-up in side-by-side relationship. Both the first lower die 704 and the second lower die 706 each have a plurality of bond pads 712, 714 on a face side or active surface 716, 718, respectively. The plurality of lead fingers 708 from the leadframe extends to their respective bond pads 712, 714. The first lower die bond pads 712 and the second lower die bond pads 714 are electrically connected to a lower surface 720 of the lead fingers 708 with solder bumps, conductive epoxy, a conductor-filed polymer or other such conductive connective material elements 722. As shown in broken lines, bond pads of both lower dice are connected to paddle 710, as for a common ground. The lower dice pair conductive connective material elements 722 may either be initially formed and located on the bond pads 712, 714 or the lead fingers 708. After the first lower die 704 and the second lower die 706 have been attached to the lead fingers 708 and/or paddle 710, a layer of passivation material 724 is deposited over and between the lead fingers 708 and the first lower die face side 716 and the second lower die face side 718.

An upper die 702, which also has a plurality of bond pads 726 on a face side or active surface 728, is also provided. The upper die bond pads 726 are attached to an upper surface 730 of the lead fingers 708 with a solder bump, conductive epoxy, a conductor-filled polymer, or other such connective conductive material elements 732. The upper die connective conductive material elements 732 can also either be initially formed on the upper die bond pads 726 or the lead fingers 708. However, prior to the attachment of the upper die 702 to lead fingers 708, the passivation layer 724 is etched by any known industry technique to form vias (not shown) to expose the upper surface 730 of the lead fingers 708 when the upper die conductive material elements 732 are initially formed on the upper die face side 728, or etched to expose the upper die conductive connective material elements 732 when the conductive material elements 732 are initially formed on the lead fingers 708. The assembly is then encased in an encapsulation material 734.

As with the prior embodiment and as depicted in broken lines with respect to lower dice 704 and 706, the paddle 710 may also be utilized as a signal-bearing lead finger, a power source lead, common ground, or the like by the upper die 702, the first lower die 704, and/or the second lower die 706.

Figure 8:
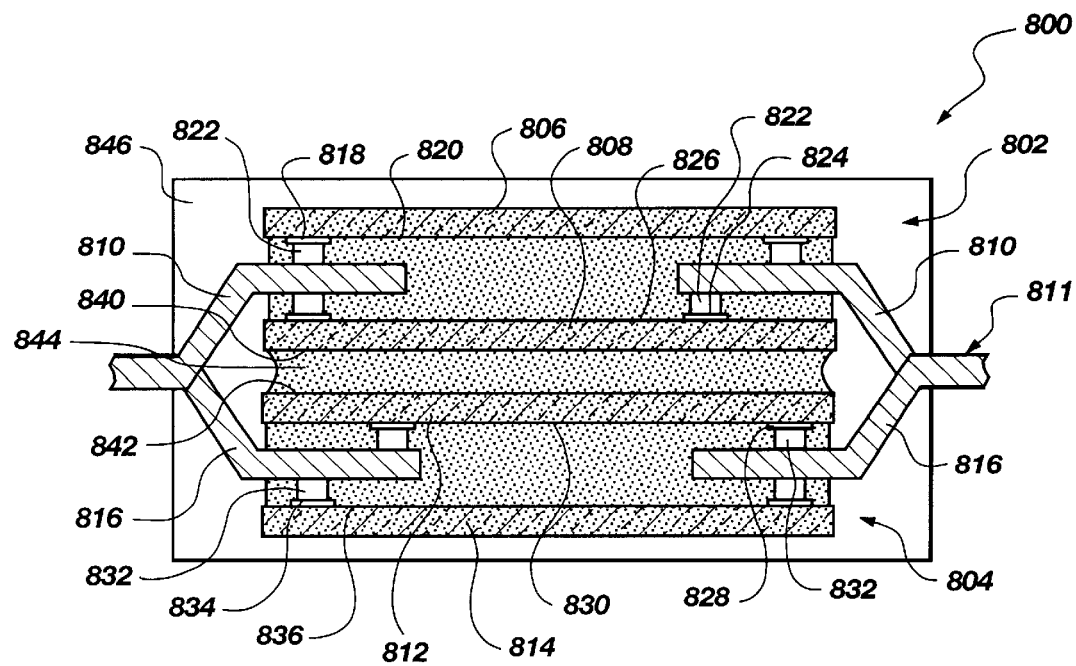
FIG. 8 is a side cross-sectional view of a multiple chip assembly of the present invention illustrating a two stacked chip pair with one leadframe assembly.

FIG. 8 illustrates a cross sectional view of an alternative multiple (four) die assembly 800 of the present invention. The die assembly 800 comprises two pair of superimposed dice, a first dice pair 802 and a second dice pair 804. The first dice pair 802 comprises a first upper die 806 and a first lower die 808, with a first portion of a plurality of lead fingers 810 from a leadframe 811 disposed between the first upper die 806 and the first lower die 808. The first dice pair 802 is constructed in a manner previously discussed, wherein a plurality of bonds pads 818 of an active surface 820 of the first upper die 806 is connected by conductive material elements 822 to their respective lead fingers 810 and a plurality of bonds pads 824 of an active surface 826 of the first lower die 808 is connected by conductive material elements 822 to their respective lead fingers 810.

The second dice pair 804 comprises a second upper die 812 and a second lower die 814, with a second portion of a plurality of lead fingers 816 from leadframe 811 disposed between the second upper die 812 and the second lower die 814. The second dice pair 804 is constructed in a manner previously discussed, wherein a plurality of bonds pads 828 of an active surface 830 of the second upper die 812 is connected by conductive material elements 832 to their respective lead fingers 816 and a plurality of bonds pads 834 of an active surface 836 of the second lower die 814 is connected by conductive material elements 832 to their respective lead fingers 816.

Preferably, a back side 840 of the first lower die 808 is attached to a back side 842 of the second upper die 812 with a layer of adhesive 844 to further stabilize the assembly. An encapsulant 846 is used to encase the assembly.

Figure 9:
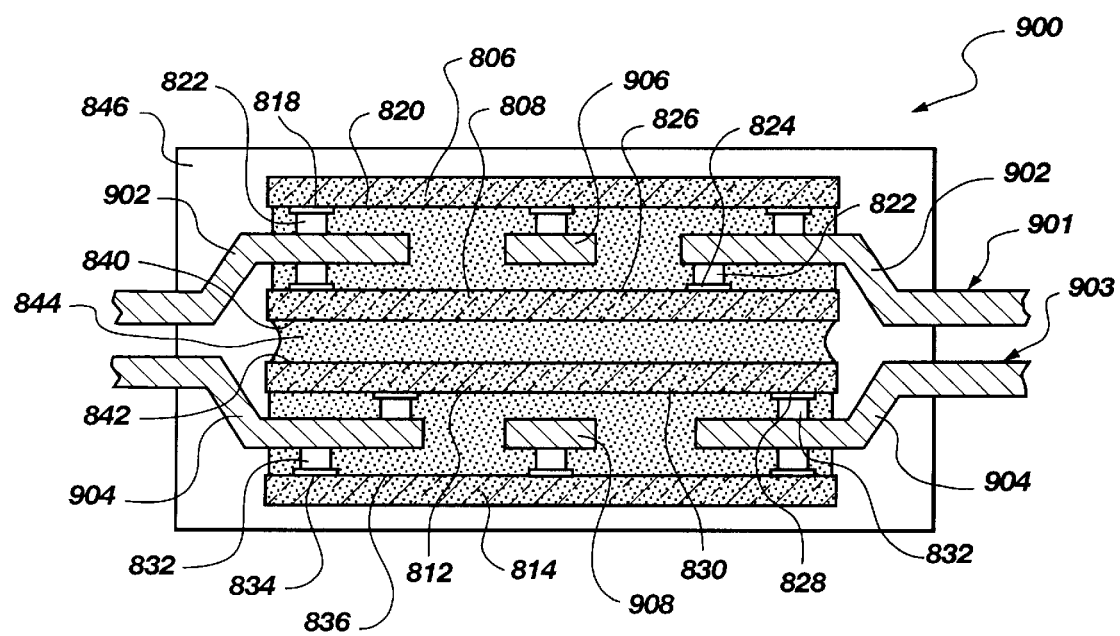
FIG. 9 is a side cross-sectional view of a multiple chip assembly of the present invention illustrating a two stacked chip pair with two leadframes assembly.

FIG. 9 illustrates a cross sectional view of another alternative multiple die assembly 900 of the present invention. The multiple die assembly 900 of FIG. 9 is similar to the multiple die assembly 800 of FIG. 8; therefore, components common to FIG. 8 and FIG. 9 retain the same numeric designation. The multiple die assembly 900 differs substantially from the multiple die assembly 800 of FIG. 8 only in the respect that two separate leadframes 901, 903 are used. Thus, a plurality of lead fingers 902 from a first leadframe 901 extends between the first upper die 806 and the first lower die 808 and a plurality of lead fingers 904 from a second leadframe 903 extends between the second upper die 812 and the second lower die 814.

Additionally, a first leadframe paddle 906 may also be utilized as a signal-bearing lead finger, power source lead, common ground, or the like by the first upper die 806 and/or first lower die 808. A second leadframe paddle 908 may also be utilized in similar fashion by the second upper die 812 and/or second lower die 814.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A method of assembling a multi-die semiconductor die assembly, comprising the steps of:

providing a first die having a face surface, with said first die face surface having a configuration of bond pads positioned thereon;

providing a second die having a face surface, with said second die face surface having a plurality of bond pads positioned thereon in a configuration different by at least one bond pad location from said first die bond pad configuration;

providing a leadframe having a first side and a second side, and a plurality of lead finger elements of differing length, orientation or configuration;

providing a die paddle on said leadframe;

employing said die paddle as a power bus for said first and second dice;

attaching said first die by its face surface to said leadframe first side, wherein at least some of said first die bond pads are in electrical communication with at least some of said plurality of lead finger elements; and attaching said second die by its face surface to said leadframe second side wherein at least some of said second die bond pads are in electrical communication with at least some of said plurality of lead finger elements.

2. The method of claim 1, further comprising disposing a passivation layer between said first die and said second die.

3. The method of claim 1, further comprising extending at least one internal lead finger segment in electrical communication between a first die bond pad and a said second die bond pad.

4. A method of assembling a multi-die semiconductor die assembly, comprising the steps of:

providing a first die having a face surface, with said first die face surface having a configuration of bond pads positioned thereon;

providing a second die having a face surface, with said second die face surface having a plurality of bond pads positioned thereon in a configuration different by at least one bond pad location from said first die bond pad configuration;

providing a leadframe having a first side and a second side, and a plurality of lead finger elements of differing length, orientation or configuration;

providing a die paddle on said leadframe;

employing said die paddle as a common ground for said first and second dice;

attaching said first die by its face surface to said leadframe first side, wherein at least some of said first die bond pads are in electrical communication with at least some of said plurality of lead finger elements; and attaching said second die by its face surface to said leadframe second side wherein at least some of said second die bond pads are in electrical communication with at least some of said plurality of lead finger elements.

5. The method of claim 4, further comprising disposing a passivation layer between said first die and said second die.

6. The method of claim 4, further comprising extending at least one internal lead finger segment in electrical communication between a first die bond pad and a said second die bond pad.

7. A method of assembling a multi-die semiconductor die assembly, comprising the steps of:

providing a first die having a face surface, with said first die face surface having a configuration of bond pads positioned thereon;

providing a second die having a face surface, with said second die face surface having a plurality of bond pads positioned thereon in a configuration different by at least one bond pad location from said first die bond pad configuration;

providing a leadframe having a first side and a second side, and a plurality of lead finger elements of differing length, orientation or configuration;

providing a die paddle on said leadframe;

employing said die paddle as a signal-bearing lead finger accessed by said first and second dice;

attaching said first die by its face surface to said leadframe first side, wherein at least some of said first die bond pads are in electrical communication with at least some of said plurality of lead finger elements; and attaching said second die by its face surface to said leadframe second side wherein at least some of said second die bond pads are in electrical communication with at least some of said plurality of lead finger elements.

8. The method of claim 7, further comprising disposing a passivation layer between said first die and said second die.

9. The method of claim 7, further comprising extending at least one internal lead finger segment in electrical communication between a first die bond pad and a said second die bond pad.

10. A method of fabricating a multi-die semiconductor die assembly, comprising:

providing a first die, face-up;

placing a leadframe over said first die and electrically connecting said leadframe to said first die in a first connection pattern;

providing a second die, face-down in at least partial superimposition to said first die;

connecting said second die to said leadframe in a first connection pattern differing from the first connection pattern in the location of at least one connection; and electrically connecting each of said first and said second dice to a common leadframe element, wherein said common leadframe element provides no external electrical access to said assembly.

11. The method of claim 10, further including encapsulating said first and second dice and any interposed portion of said leadframe.

12. The method of claim 10, further including applying a passivation material between said first die, said leadframe and said second die prior to encapsulation.

13. A method of fabricating a multi-die semiconductor die assembly, comprising:

provided a first die, face-up;

placing a leadframe over said first die and electrically connecting said leadframe to said first die in a first connection pattern;

providing a second die, face-down in at least partial superimposition to said first die;

connecting said second die to said leadframe in a first connection pattern differing from the first connection pattern in the location of at least one connection; and electrically connecting each of said first and said second dice to a common leadframe element, wherein said common leadframe element provides common external electrical access to said first and second dice.

14. The method of claim 13, further including encapsulating said first and second dice and any interposed portion of said leadframe.

15. The method of claim 13, further including applying a passivation material between said first die, said leadframe and said second die prior to encapsulation.

* * * * *

UNITED STATES PATENT AND TRADEMARK OFFICE
CERTIFICATE OF CORRECTION

PATENT NO : 5,770,480
DATED : June 23, 1998
INVENTOR(S) : Ma et al.

It is certified that error appears in the above-identified patent and that said Letters Patent is hereby corrected as shown below:

Title page, item [57
In the abstract, line 3, change "a least" to --at least--;
In column 3, line 41, change "though" to --through--;
In column 7, line 60, change "conductor-filed" to --conductor-filled--;

Signed and Sealed this

Twenty-fourth Day of August, 1999

Attest:

Q. TODD DICKINSON

Attesting Officer     Acting Commissioner of Patents and Trademarks